United States Patent
Chiu et al.

(10) Patent No.: US 11,858,086 B2
(45) Date of Patent: Jan. 2, 2024

(54) HIGH-THROUGHPUT, PRECISE SEMICONDUCTOR SLURRY BLENDING TOOL

(71) Applicant: Taiwan Semiconductor Manufacturing Company Limited, Hsinchu (TW)

(72) Inventors: Chi-Wei Chiu, Hsinchu (TW);
Yung-Long Chen, New Taipei (TW);
Bo-Zhang Chen, Hsinchu (TW);
Chong-Cheng Su, Hsinchu (TW);
Yu-Chun Chen, Hsinchu (TW);
Ching-Jung Hsu, Hsinchu (TW);
Chi-Tung Lai, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 642 days.

(21) Appl. No.: 16/901,588

(22) Filed: Jun. 15, 2020

(65) Prior Publication Data

US 2021/0387306 A1 Dec. 16, 2021

(51) Int. Cl.
*B24B 37/04* (2012.01)
*B24B 57/02* (2006.01)
*H01L 21/306* (2006.01)
*B01F 23/50* (2022.01)

(52) U.S. Cl.
CPC .............. *B24B 37/04* (2013.01); *B24B 57/02* (2013.01); *H01L 21/30625* (2013.01); *B01F 23/56* (2022.01)

(58) Field of Classification Search
None
See application file for complete search history.

(56) References Cited

U.S. PATENT DOCUMENTS 4,252,139 A * 2/1981 Davis .................... B01F 35/892
222/64
5,417,346 A * 5/1995 Ferri, Jr. ........... H01L 21/67276
222/61

(Continued)

FOREIGN PATENT DOCUMENTS

CN 202725056 U 2/2013
CN 106139941 A * 11/2016 ............ B01F 1/0038

(Continued)

OTHER PUBLICATIONS

Taiwanese Office Action issued in Application No. 11021179560, dated Nov. 30, 2021, 5 Pages.

*Primary Examiner* — Sylvia Macarthur
(74) *Attorney, Agent, or Firm* — Harrity & Harrity, LLP

(57) ABSTRACT

A slurry blending tool may include a blending tank to receive and blend one or more materials into a slurry, and at least one inlet pipe connected to the blending tank and to provide the one or more materials to the blending tank. The at least one inlet pipe may vertically enter the blending tank and may not contact the blending tank. The slurry blending tool may include a blending pump partially provided within the blending tank and to blend the one or more materials into the slurry. The slurry blending tool may include an outlet pipe connected to the blending pump and to remove the slurry from the blending tank.

20 Claims, 10 Drawing Sheets

(56) References Cited

U.S. PATENT DOCUMENTS

| | | | | |
|---|---|---|---|---|
| 5,611,937 | A * | 3/1997 | Jarocki | C02F 1/76 210/764 |
| 5,750,440 | A * | 5/1998 | Vanell | B24B 37/04 438/692 |
| 6,123,602 | A * | 9/2000 | Rodriguez | B24B 57/02 451/60 |
| 6,254,720 | B1 * | 7/2001 | Shih | B08B 9/0325 134/104.1 |
| 6,328,631 | B1 * | 12/2001 | Fukano | F25C 5/20 451/39 |
| 6,616,014 | B1 * | 9/2003 | Pozniak | B24B 37/04 222/129.3 |
| 6,884,317 | B2 * | 4/2005 | Sprey | H01L 21/31116 257/E21.252 |
| 6,957,749 | B2 * | 10/2005 | Achkire | H01L 21/67057 222/3 |
| 7,081,182 | B2 * | 7/2006 | Ryu | H01L 22/26 156/345.12 |
| 9,193,032 | B2 * | 11/2015 | Chen | B24B 37/34 |
| 2003/0010792 | A1 * | 1/2003 | Forshey | B01F 35/7543 222/145.6 |
| 2004/0031754 | A1 * | 2/2004 | Pesiri | B01F 23/53 239/10 |
| 2005/0201200 | A1 * | 9/2005 | Fleig | B01F 35/2211 366/153.1 |
| 2021/0387306 | A1 * | 12/2021 | Chiu | B24B 37/34 |

FOREIGN PATENT DOCUMENTS

| | | | |
|---|---|---|---|
| CN | 207463160 U | 6/2018 | |
| CN | 108479468 A * | 9/2018 | |
| CN | 109529694 A * | 3/2019 | |
| GB | 2147819 A * | 5/1985 | ........ B01F 15/00123 |
| JP | 2253835 A | 10/1990 | |
| JP | 2019069420 A | 5/2019 | |
| WO | WO-2012084005 A1 * | 6/2012 | ......... A47L 15/0055 |

* cited by examiner

400

Linear measurement

| Standard weight (kg) | Measurement weight (kg) | Difference (g) |
|---|---|---|
| 20 | 19.9990 | -1.0 |
| 50 | 49.9985 | -1.5 |
| 100 | 100.0010 | 1.0 |
| 150 | 149.9995 | -0.5 |
| 200 | 199.9970 | -3.0 |

420

Reproducibility (measurement 50 kg and repeat 6 times)

| Standard weight (kg) | Measurement weight (kg) | Difference (g) |
|---|---|---|
| 50 | 49.9990 | -1.0 |
| 50 | 50.0005 | 0.5 |
| 50 | 50.0010 | 1.0 |
| 50 | 50.0025 | 2.5 |
| 50 | 50.0020 | 2.0 |
| 50 | 50.0000 | 0.0 |
| Standard deviation (kg) | 0.0012 | |

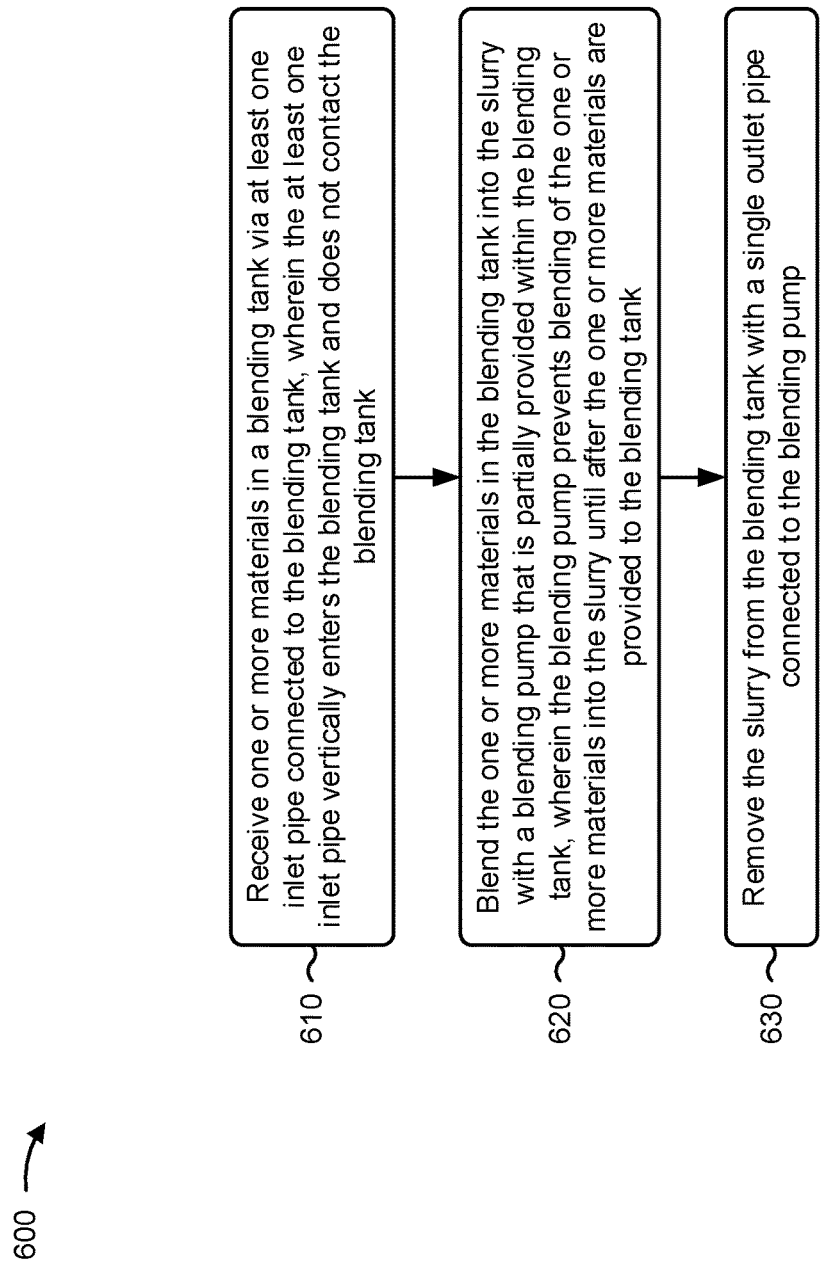

HIGH-THROUGHPUT, PRECISE SEMICONDUCTOR SLURRY BLENDING TOOL

BACKGROUND

A slurry is a mixture of solids denser than water suspended in liquid, such as water. Solid particles in a slurry may include sizes that vary from one micron up to hundreds of millimeters. Depending on the mixture, the slurry may be abrasive and/or corrosive.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A and 4B are diagrams of example tables associated with the semiconductor slurry blending tool described herein.

FIG. 6 is a flowchart of an example process for generating a semiconductor slurry with a high-throughput, precise semiconductor slurry blending tool.

DETAILED DESCRIPTION

Figure 1A:
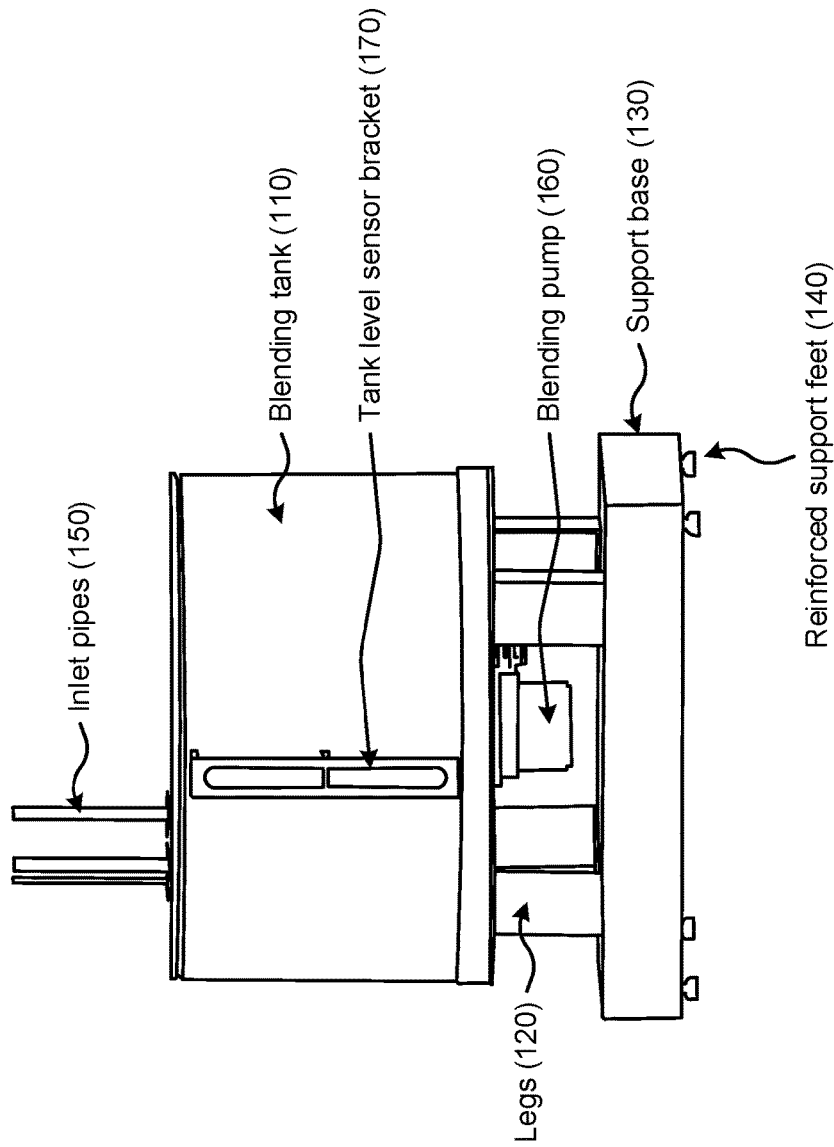
FIGS. 1A-3B are diagrams of an example implementation of a semiconductor slurry blending tool described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some instances, a chemical-mechanical polishing (CMP) tool may utilize a slurry to planarize a semiconductor device. For example, a CMP tool may utilize an abrasive and corrosive chemical slurry (e.g., commonly a colloid) in conjunction with a polishing pad and retaining ring, typically of a greater diameter than the semiconductor device, when planarizing the semiconductor device. Different slurries may be required when planarizing different layers of a semiconductor device due to different materials being utilized with different layers. The average number slurry generations required for semiconductor processing has increased dramatically over time. Current techniques require between seven and forty days to modify a slurry tool for a different slurry, which negatively impacts a semiconductor processing schedule. Such current techniques produce slurries with a quality error of between thirty and one-hundred and seventy parts per million (ppm) of contamination, resulting in differences in the quality of the slurry provided for semiconductor processes. Thus, current techniques produce imprecise and inconsistent slurries, and are unable to meet slurry requirements for a large quantity of advanced semiconductor processes.

According to some implementations described herein, a high-throughput, precise semiconductor slurry blending tool may generate high quality slurries that meet slurry requirements for a large quantity of advanced semiconductor processes. For example, the high-throughput, precise semiconductor slurry blending tool may include a blending tank to receive and blend one or more materials into a slurry, and at least one inlet pipe connected to the blending tank and to provide the one or more materials to the blending tank. The at least one inlet pipe may vertically enter the blending tank and may not contact the blending tank. The high-throughput, precise semiconductor slurry blending tool may include a blending pump partially provided within the blending tank and to blend the one or more materials into the slurry, and an outlet pipe connected to the blending pump and to remove the slurry from the blending tank.

In this way, the high-throughput, precise semiconductor slurry blending tool may generate high quality slurries that meet slurry requirements for a large quantity of advanced semiconductor processes. For example, the high-throughput, precise semiconductor slurry blending tool may produce high quality slurries (e.g., with a quality error of seventeen ppm of contamination), and may only require one day to modify a semiconductor slurry blending tool for a different slurry. This may significantly reduce cycle times associated with a semiconductor processing schedule (e.g., by two-hundred and thirty days over the course of a year), and may result in significant cost savings each year. Furthermore, the high-throughput, precise semiconductor slurry blending tool may improve flexibility of slurry blending by dynamically adjusting a blending recipe and measuring a difference in raw material quality.

Figure 1B:
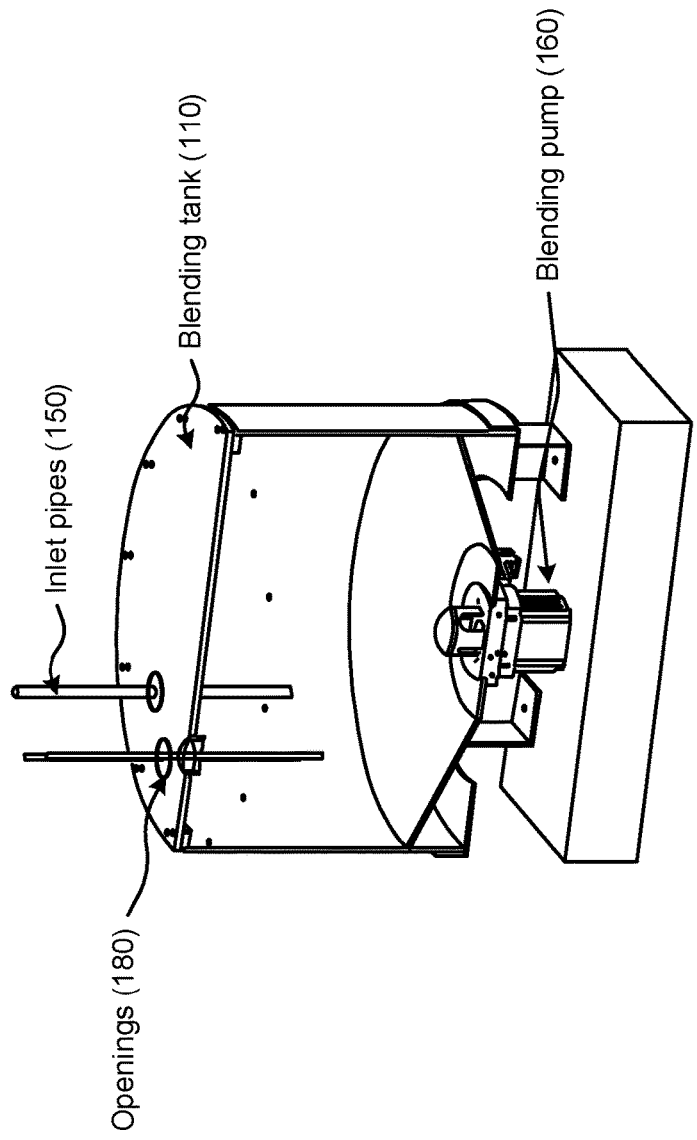

FIGS. 1A and 1B are diagrams 100 of a semiconductor slurry blending tool described herein. As shown in FIG. 1A, the semiconductor slurry blending tool may include a blending tank 110, legs 120, a support base 130, reinforced support feet 140, inlet pipes 150, a blending pump 160, and a tank level sensor bracket 170.

Blending tank 110 may include a tank to receive and store materials that are blended to make slurries. Blending tank 110 may be sized and shaped depending on required volumes of slurries to be produced by the semiconductor slurry blending tool. For example, blending tank 110 may be sized to store two-hundred and fifty (250) liters or more of a slurry or materials to make the slurry. Blending tank 110 may be cylindrical in shape to aid in the blending process, but may be other shapes, such as box-shaped, spherical, and/or the like. In some implementations, blending tank 110 is constructed of a material or materials that are resistant to abrasion and/or corrosion caused by a slurry and/or materials to make the slurry. For example, blending tank 110 may be constructed of polyvinyl chloride (PVC), chlorinated PVC (CPVC), polyvinylidene difluoride (PVDF), polypropylene, polyethylene, and/or the like. In some implementations, blending tank 110 includes walls with thicknesses that provide a rigid structure capable storing and/or blending more than two-hundred and fifty (250) liters of materials.

Legs 120 may connect to blending tank 110 and support base 130 and may support blending tank 110 on support base 130. Three or more legs 120 may be connected to a bottom surface of blending tank 110 and to a top surface of support base 130 (e.g., via connectors, such as screws, bolts, welding, glue, and/or the like). In some implementations, legs 120 are constructed of a material or materials that are rigid enough to support a weight of blending tank 110 as well as a weight of the slurry or materials provided in blending tank 110. For example, legs 120 may be constructed of a material or materials (e.g., steel, aluminum, and/or the like) capable of supporting a weight of more than two-hundred (200) kilograms.

Support base 130 may connect to legs 120 and may support blending tank 110 and legs 120. As shown, support base 130 may be rectangular or box-shaped, but may be other shapes, such as cylindrical. In some implementations, support base 130 is constructed of a material or materials that are rigid enough to support a weight of blending tank 110 as well as a weight of the slurry or materials provided in blending tank 110. For example, support base 130 may be constructed of a material or materials (e.g., steel, aluminum, concrete, and/or the like) capable of supporting a weight of more than two-hundred (200) kilograms. In some implementations, support base 130 includes a scale to measure weights of slurries and/or materials to make slurries stored in blending tank 110. The scale may enable accurate measurements of materials provided to blending tank 110 and/or slurries generated by blending tank 110. Alternatively, the scale may be provided separately from support base 130.

Reinforced support feet 140 may connect to support base 130 and may support blending tank 110, legs 120, and support base 130. Three or more reinforced support feet 140 may be connected to a bottom surface of support base 130 (e.g., via connectors, such as screws, bolts, welding, glue, and/or the like). In some implementations, reinforced support feet 140 are constructed of a material or materials that are rigid enough to support a weight of blending tank 110, a weight of the slurry or materials provided in blending tank 110, a weight of legs 120, and a weight of support base 130. For example, reinforced support feet 140 may be constructed of a material or materials (e.g., steel, aluminum, and/or the like) capable of supporting a weight of more than two-hundred (200) kilograms. In some implementations, when support base 130 includes the scale, reinforced support feet 140 are connected at particular positions under support base 130 to ensure that the scale provides accurate measurements of materials provided to blending tank 110 and/or slurries generated by blending tank 110.

Inlet pipes 150 may be provided through the top surface of blending tank 110 and may provide the materials (e.g., water, abrasive chemical materials, corrosive chemical materials, and/or the like) to make slurries to blending tank 110. In some implementations, two or more inlet pipes 150 are provided through the top surface of blending tank 110. In some implementations, inlet pipes 150 are constructed of a material or materials that are resistant to abrasion and/or corrosion caused by the materials to make the slurry. For example, inlet pipes 150 may be constructed of PVC, CPVC, PVDF, polypropylene, polyethylene, and/or the like. In some implementations, inlet pipes 150 include walls with thicknesses that provide a rigid structure capable of handling pressurized provision of the materials to blending tank 110. Further details of inlet pipes 150 are described below in connection with FIGS. 1B and 2B.

Blending pump 160 may connect to the bottom surface of blending tank 110 and may be partially provided within an interior of blending tank 110. Blending pump 160 may mechanically stir materials provided to blending tank 110 to ensure a homogenous blend of a slurry. Blending pump 160 may transfer the slurry to a reservoir for storage and/or to a CMP tool for utilization. In some implementations, blending pump 160 is constructed of a material or materials that are resistant to abrasion and/or corrosion caused by the materials to make the slurry. For example, blending pump 160 may be constructed of PVC, CPVC, PVDF, polypropylene, polyethylene, and/or the like. Further details of blending pump are described below in connection with FIGS. 1B, 2A, and 3B.

Tank level sensor bracket 170 may be spaced apart from outer walls of blending tank 110 and may retain multiple tank level sensors that measure a level of materials or slurry provided in blending tank 110. In some implementations, tank level sensor bracket 170 is constructed of a material or materials that are rigid enough to support weights of the multiple tank level sensors. For example, tank level sensor bracket 170 may be constructed of steel, aluminum, plastic, and/or the like. Further details of tank level sensor bracket 170 and the multiple tank level sensors are described below in connection with FIG. 3A.

FIG. 1B provides a cutaway view of an interior of blending tank 110. As shown, blending tank 110 may be cylindrical in shape and may include openings 180 provided through a top of blending tank 110. Openings 180 may be provided to receive inlet pipes 150 within blending tank 110. As further shown in FIG. 1B, inlet pipes 150 may extend through openings 180 and into the interior of blending tank 110. A portion of blending pump 160 may also extend into the interior of blending tank 110. The portion of blending pump 160 extending into blending tank 110 may be utilized to mechanically stir materials provided to blending tank 110.

As indicated above, FIGS. 1A and 1B are provided merely as one or more examples. Other examples may differ from what is described with regard to FIGS. 1A and 1B.

Figure 2A:
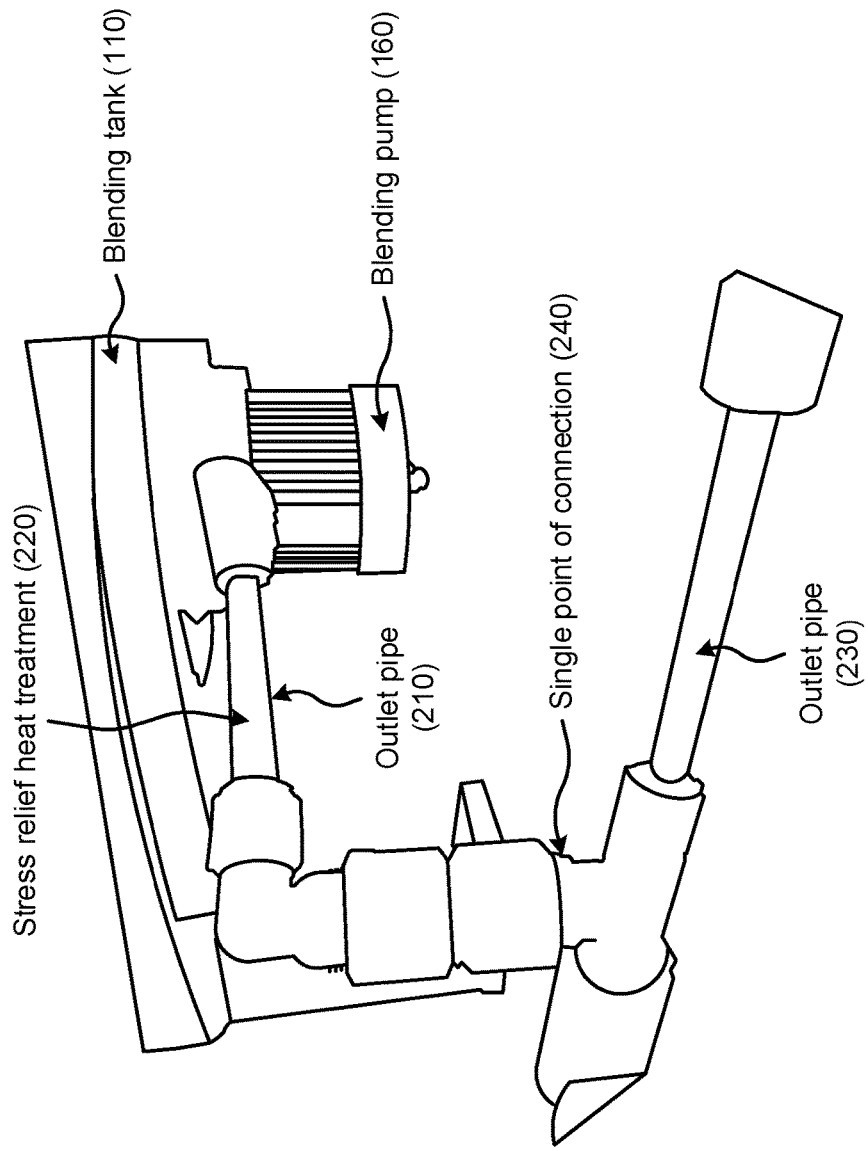
Figure 2B:
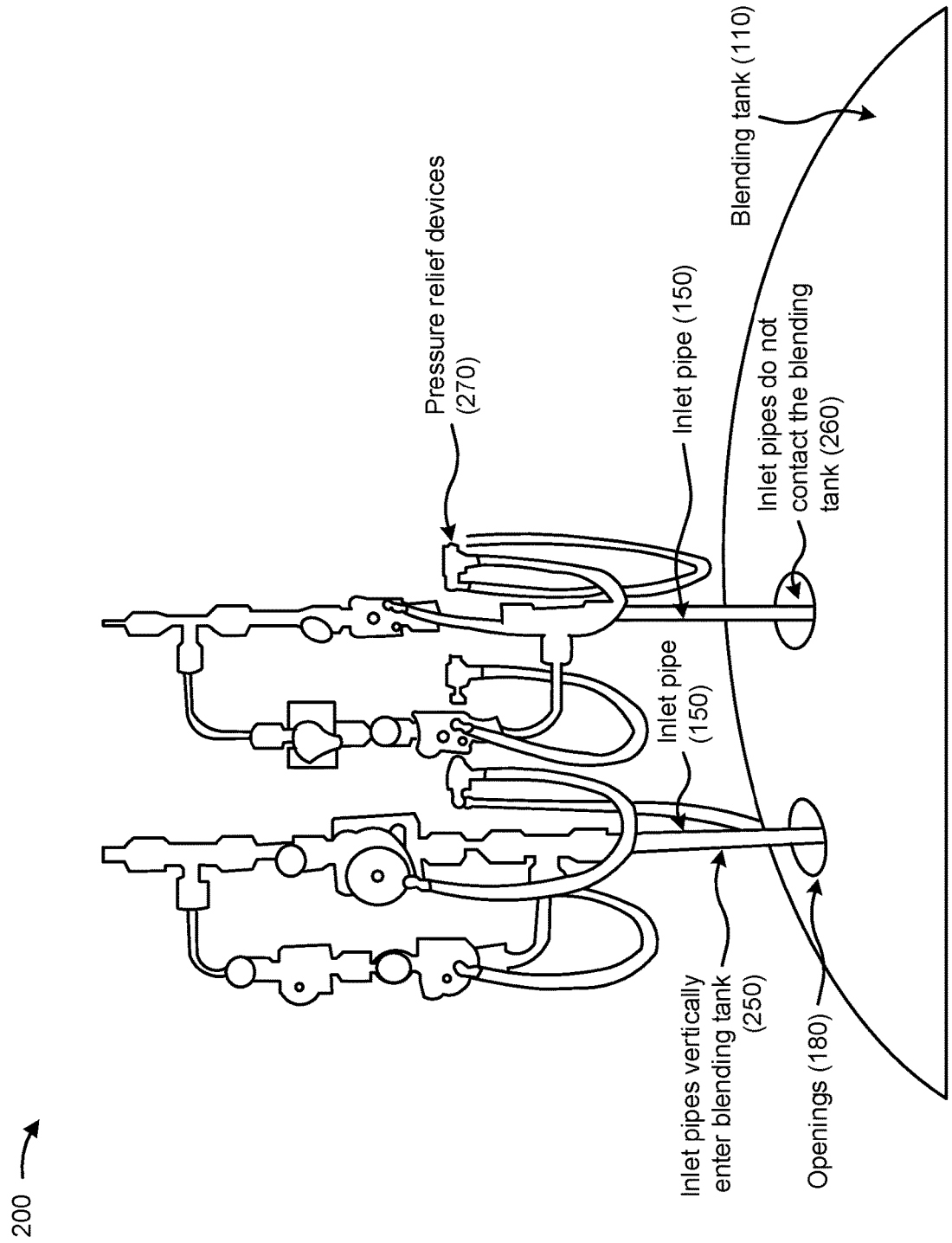

FIGS. 2A and 2B are further diagrams 200 of portions of the semiconductor slurry blending tool described herein. As shown in FIG. 2A, blending pump 160 may connect with an outlet pipe 210. Outlet pipe 210 may provide a slurry from blending tank 110 to a reservoir for storage and/or to a CMP tool for utilization. In some implementations, outlet pipe 210 is constructed of a material or materials that are resistant to abrasion and/or corrosion caused by the slurry. For example, outlet pipe 210 may be constructed of PVC, CPVC, PVDF, polypropylene, polyethylene, and/or the like. In some implementations, outlet pipe 210 includes a wall with a thickness that provides a rigid structure capable of handling pressurized provision of the slurry to the reservoir or the CMP tool. As shown by reference number 220, outlet pipe 210 may be constructed of a material that has undergone a stress relief heat treatment. Stress relief heat treatment includes heating outlet pipe 210 to a glass transition temperature in order to cause stress molecular lattices between plastics to rearrange to release stress from outlet pipe 210. This may prevent damage to outlet 210 caused by the slurry exiting blending tank 110.

As further shown in FIG. 2A, another outlet pipe 230 may connect with outlet pipe 210 via a single point of connection 240. Outlet pipe 230 may provide a slurry from blending tank 110 to a reservoir for storage and/or to a CMP tool for utilization. In some implementations, outlet pipe 230 is constructed of a material or materials that are resistant to abrasion and/or corrosion caused by the slurry. For example, outlet pipe 230 may be constructed of PVC, CPVC, PVDF, polypropylene, polyethylene, and/or the like. In some implementations, outlet pipe 230 includes a wall with a thickness that provides a rigid structure capable of handling pressurized provision of the slurry to the reservoir or the CMP tool. In some implementations, outlet pipe 230 is constructed of a material that has undergone a stress relief heat treatment to prevent damage to outlet pipe 230 cause by the slurry exiting blending tank 110. The single point of connection 240 (e.g., via an elbow connector) may relieve stress in outlet pipe 210 and/or outlet pipe 230 relative to current slurry tool configurations, which may extend a useful life of outlet pipe 210 and/or outlet pipe 230 and may prevent damage to outlet pipe 210 and/or outlet pipe 230 caused by the slurry.

As shown in FIG. 2B, and by reference number 250, inlet pipes 150 may vertically enter blending tank 110 through openings 180 and may vertically extend into the interior of blending tank 110. In some implementations, openings 180 are sized so that inlet pipes 150 do not contact blending tank 110, as indicated by reference number 260. Providing inlet pipes 150 vertically into blending tank 110, without contacting blending tank 110, may relieve stress in inlet pipes 150 relative to current slurry tool configurations, which may extend useful lives of inlet pipes 150.

As further shown in FIG. 2B, and by reference number 270, inlet pipes 150 may be associated with pressure relief devices that connect to material inlet valves with driving air source pipes. Adding the pressure relief devices to the driving air source pipes of material inlet valves improves speeds of operations of the material inlet valves, prevents feeding errors caused by delayed closings of the material inlet valves, controls provision of the materials to blending tank 110, and/or the like.

As indicated above, FIGS. 2A and 2B are provided merely as one or more examples. Other examples may differ from what is described with regard to FIGS. 2A and 2B.

Figure 3A:
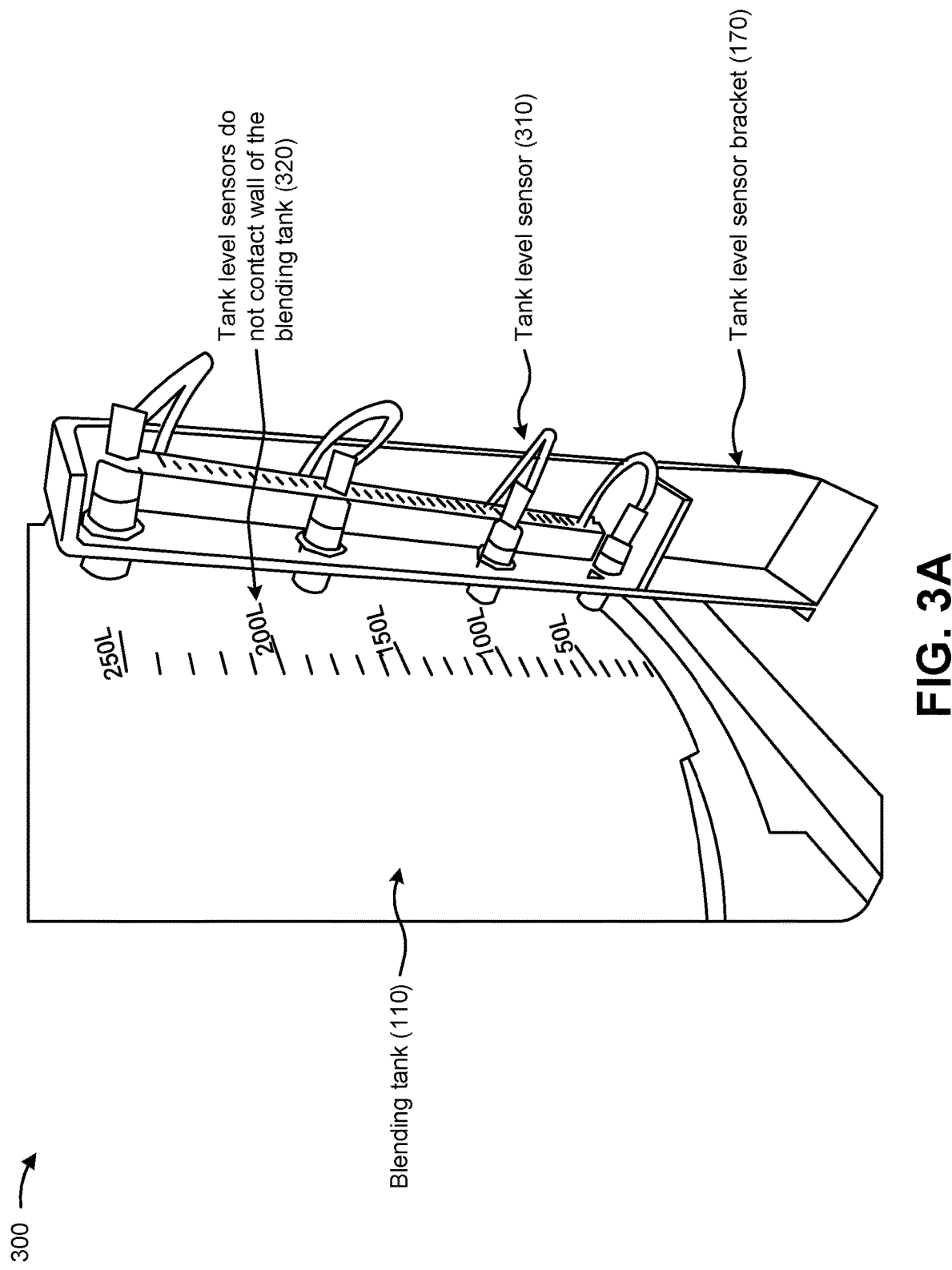
Figure 3B:
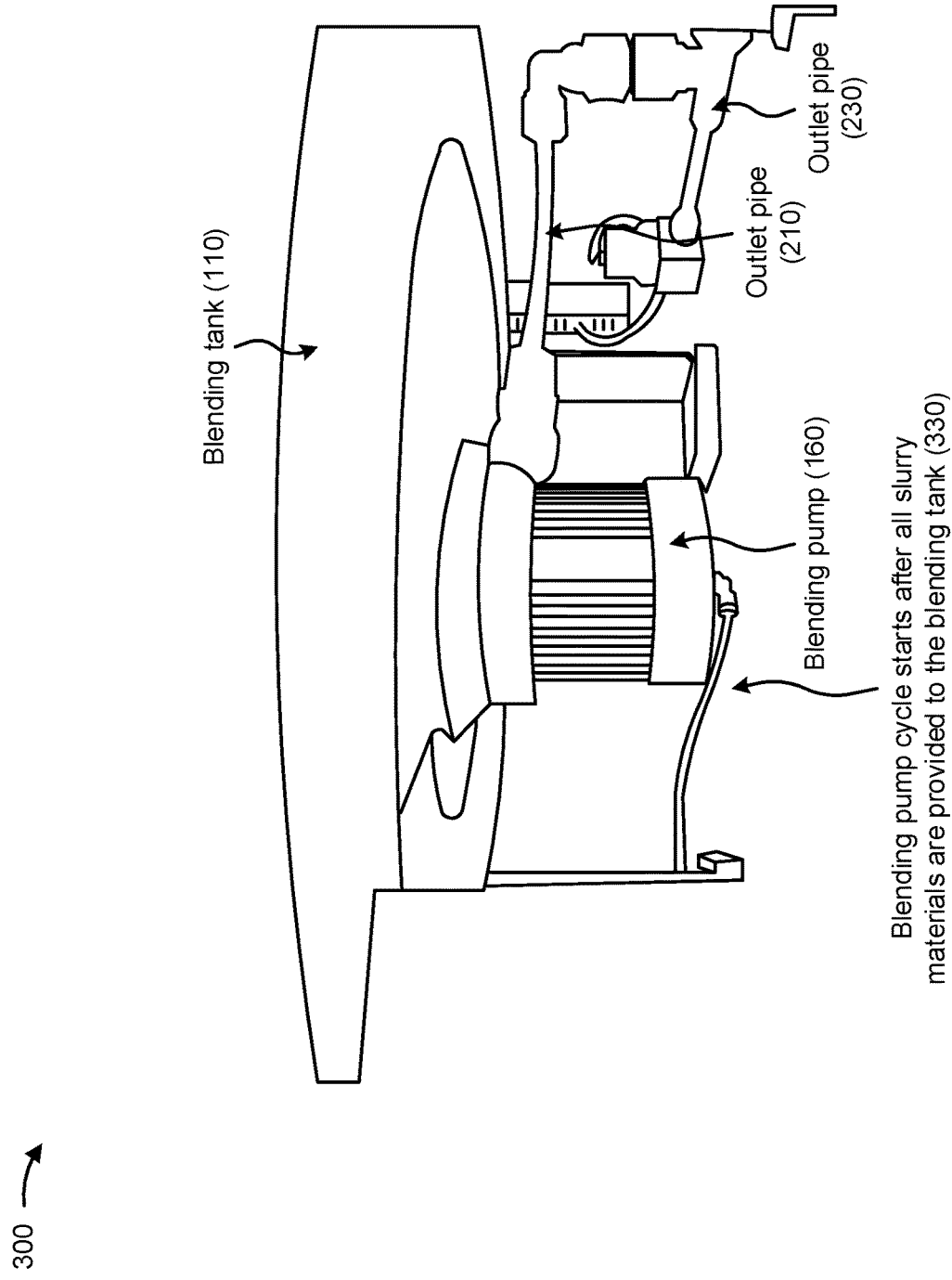

FIGS. 3A and 3B are further diagrams 300 of portions of the semiconductor slurry blending tool described herein. As shown in FIG. 3A, tank level sensor bracket 170 may be provided adjacent to blending tank 110, and may retain multiple tank level sensors 310. Tank level sensors 310 may include sensors that measure a level of materials or slurry provided in blending tank 110. For example, tank level sensors 310 may include optical sensors that capture images of the wall of blending tank 110 and the materials or slurry provided in blending tank 110. In such an arrangement, the wall of blending tank 110 may be transparent or partially transparent so that the level of the materials or the slurry provided in blending tank 110 may be seen through the wall and captured by the optical sensors. As further shown in FIG. 3A, and by reference number 320, tank level sensor bracket 170 and tank level sensors 310 may not contact the wall of blending tank 110. Preventing tank level sensors 310 from contacting the wall of blending tank 110 may relieve stress in signal wires of tank level sensors 310 relative to current slurry tool configurations, which may prevent damage to the signal wires. Furthermore, blending tank 110 and tank level sensors 310 may be protected from damage that may occur when tank level sensors 310 contact the wall of blending tank 110. For example, if tank level sensors 310 contact the wall of blending tank 110, movement of blending tank 110 may cause tank level sensors 310 to rub against and possibly damage the wall of blending tank 110 and/or tank level sensors 310.

As shown in FIG. 3B, blending pump 160 may connect with blending tank 110, outlet pipe 210, and outlet pipe 230, as described above. As further shown in FIG. 3B, and by reference number 330, a cycle for blending pump 160 may start after all the slurry materials are provided to blending tank 110 by inlet pipes 150. Preventing blending pump 160 from starting until inlet pipes 150 provide all of the slurry materials to blending tank 110 may reduce vibration in the semiconductor slurry blending tool relative to current slurry tool configurations. Preventing blending pump 160 from starting until inlet pipes 150 provide all of the slurry materials to blending tank 110 may also improve a quality of the slurry. For example, if blending of the materials in blending tank 110 occurs when there is a disproportionate quantity of materials in blending tank 110 would impact the quality of the slurry relative to waiting until all of the materials are received in blending tank 110 (e.g., a proportionate quantity of materials).

As indicated above, FIGS. 3A and 3B are provided merely as one or more examples. Other examples may differ from what is described with regard to FIGS. 3A and 3B.

Figure 4A:

FIGS. 4A and 4B are diagrams 400 of example tables associated with the semiconductor slurry blending tool described herein. As shown in FIG. 4A, and by table 410, the semiconductor slurry blending tool may include several improved designs (e.g., relative current slurry tool configurations) that address influence factors (e.g., problems, such as piping stress, sensor signal cable stress, vibration, structural load bearing, feeding control, and/or the like) and improve an accuracy of weight measurement (e.g., by the scale of support base 130) of slurries generated by the semiconductor slurry blending tool. For example, outlet pipe 230 may connect with outlet pipe 210 via a single point of connection, as indicated by reference number 240 in FIG. 2A. The single point of connection may relieve stress in outlet pipe 210 and/or outlet pipe 230 and may improve an accuracy of weight measurement by ±10 grams.

As further shown in table 410, outlet pipe 210 may be constructed of a material that has undergone a stress relief heat treatment, as described above in connection with FIG. 2A. Stress relief heat treatment may cause stress molecular lattices between plastics to rearrange to release stress from outlet pipe 210, and may improve an accuracy of weight measurement by ±10 grams. Inlet pipes 150 may vertically enter blending tank 110 through openings 180 and may vertically extend into the interior of blending tank 110, as described above in connection with FIG. 2B. Providing inlet pipes 150 vertically into blending tank 110 may relieve stress in inlet pipes 150 and may improve an accuracy of weight measurement by ±5 grams. Openings 180 may be sized so that inlet pipes 150 do not contact blending tank 110, as further described above in connection with FIG. 2B. Preventing inlet pipes 150 from contacting blending tank 110 may relieve stress in inlet pipes 150 and may improve an accuracy of weight measurement by ±5 grams.

As further shown in table 410, tank level sensor bracket 170 may prevent tank level sensors 310 from contacting a wall of blending tank 110, as described above in connection with FIG. 3A. Preventing tank level sensors 310 from contacting the wall of blending tank 110 may relieve stress in signal wires of tank level sensors 310 and may improve an accuracy of weight measurement by ±3 grams. A cycle for blending pump 160 may start after all the slurry materials are provided to blending tank 110 by inlet pipes 150, as described above in connection with FIG. 3B. Preventing blending pump 160 from starting until inlet pipes 150 provide all of the slurry materials to blending tank 110 may reduce vibration in the semiconductor slurry blending tool and may improve an accuracy of weight measurement by ±50 grams.

As further shown in table 410, reinforced support feet 140 may connect to support base 130 and may support blending tank 110, legs 120, and support base 130, as described above in connection with FIG. 1A. Providing reinforced support feet 140 may improve structural load bearing of the semiconductor slurry blending tool and may improve an accuracy of weight measurement by ±20 grams. Inlet pipes 150 may be associated with the pressure relief devices that connect to the material inlet valves with the driving air source pipes. Adding the pressure relief devices to the driving air source pipes of material inlet valves improves speeds of operations of the material inlet valves, prevents feeding errors caused by delayed closings of the material inlet valves, controls provision of the materials to blending tank 110, and/or the like. Adding the pressure relief devices to the driving air source pipes of material inlet valves may improve an accuracy of weight measurement by ±50 grams.

As shown in FIG. 4B, and by table 420, a linear measurement of materials or slurries provided in the semiconductor slurry blending tool may include providing increasing standard weights (in kilograms) of the materials or the slurries in blending tank 110, determining measurement weights (in kilograms) of the materials or the slurries in blending 110 (e.g., with the scale of support base 130), and calculating differences (in grams) between the standard weights and the measurement weights. As shown by table 420, the standard weights and measurements weights are nearly identical, with a largest measurement error of 3 grams. Thus, the semiconductor slurry blending tool provides much more accurate measurements of the materials or the slurries in blending tank 110 relative to current slurry tool configurations.

As further shown in FIG. 4B, and by table 430, a reproducibility measurement of materials or slurries provided in the semiconductor slurry blending tool may include providing a standard weight (e.g., 50 kilograms) of the materials or the slurries in blending tank 110, determining measurement weights (e.g., in kilograms) of the materials or the slurries in blending tank 110 (e.g., with the scale of support base 130) six times, and calculating differences (in grams) between the standard weights and the measurement weights. As shown by table 430, the standard weight and the repeated measurements weights are nearly identical, with a largest measurement error of 2.5 grams (e.g., which is equivalent to a quality error of 17 ppm of contamination) and a standard deviation of 1.2 grams. Thus, the semiconductor slurry blending tool provides much more accurate measurements of the materials or the slurries in blending tank 110 relative to current slurry tool configurations.

As indicated above, FIGS. 4A and 4B are provided merely as one or more examples. Other examples may differ from what is described with regard to FIGS. 4A and 4B.

Figure 5:
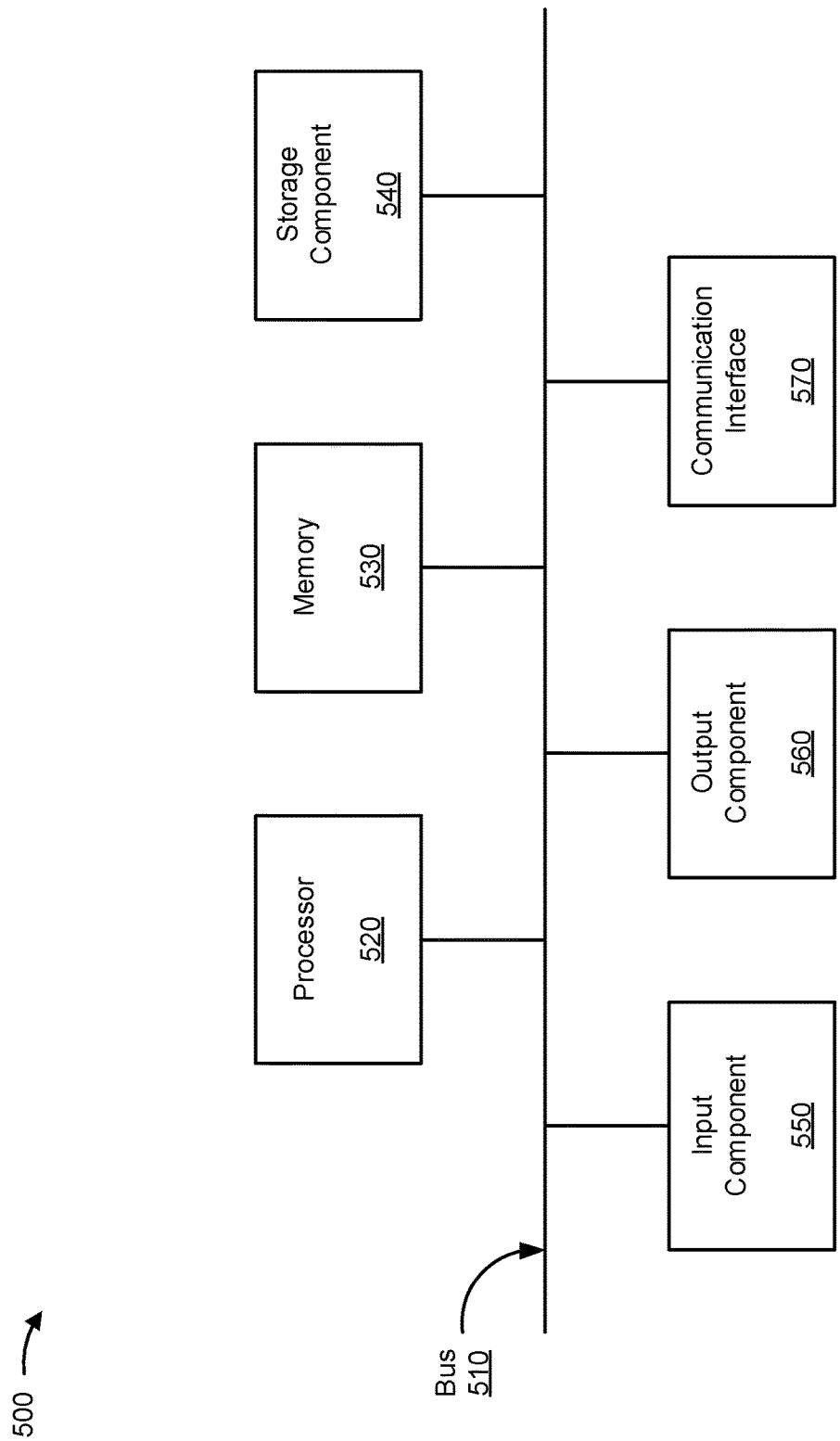
FIG. 5 is a diagram of example components of the semiconductor slurry blending tool of FIG. 1.

FIG. 5 is a diagram of example components of a device 500. Device 500 may correspond to the semiconductor slurry blending tool. In some implementations, the semiconductor slurry blending tool may include one or more devices 500 and/or one or more components of device 500. As shown in FIG. 5, device 500 may include a bus 510, a processor 520, a memory 530, a storage component 540, an input component 550, an output component 560, and a communication interface 570.

Bus 510 includes a component that permits communication among the components of device 500. Processor 520 is implemented in hardware, firmware, or a combination of hardware and software. Processor 520 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 520 includes one or more processors capable of being programmed to perform a function. Memory 530 includes a random access memory (RAM), a read only memory (ROM), and/or another type of dynamic or static storage device (e.g., a flash memory, a magnetic memory, and/or an optical memory) that stores information and/or instructions for use by processor 520.

Storage component 540 stores information and/or software related to the operation and use of device 500. For example, storage component 540 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive.

Input component 550 includes a component that permits device 500 to receive information, such as via user input (e.g., a touch screen display, a keyboard, a keypad, a mouse, a button, a switch, and/or a microphone). Additionally, or alternatively, input component 550 may include a sensor for sensing information (e.g., a global positioning system (GPS) component, an accelerometer, a gyroscope, and/or an actuator). Output component 560 includes a component that provides output information from device 500 (e.g., a display, a speaker, and/or one or more LEDs).

Communication interface 570 includes a transceiver-like component (e.g., a transceiver and/or a separate receiver and transmitter) that enables device 500 to communicate with other devices, such as via a wired connection, a wireless connection, or a combination of wired and wireless connections. Communication interface 570 may permit device 500 to receive information from another device and/or provide information to another device. For example, communication interface 570 may include an Ethernet interface, an optical interface, a coaxial interface, an infrared interface, an RF interface, a universal serial bus (USB) interface, a wireless local area interface, a cellular network interface, and/or the like.

Device 500 may perform one or more processes described herein. Device 500 may perform these processes based on processor 520 executing software instructions stored by a non-transitory computer-readable medium, such as memory 530 and/or storage component 540. A computer-readable medium is defined herein as a non-transitory memory device. A memory device includes memory space within a single physical storage device or memory space spread across multiple physical storage devices.

Software instructions may be read into memory 530 and/or storage component 540 from another computer-readable medium or from another device via communication interface 570. When executed, software instructions stored in memory 530 and/or storage component 540 may cause processor 520 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 5 are provided as an example. In practice, device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

FIG. 6 is a flow chart of an example process 600 for generating a semiconductor slurry with a high-throughput, precise semiconductor slurry blending tool. In some implementations, one or more process blocks of FIG. 6 may be performed by a semiconductor slurry blending tool (e.g., the semiconductor slurry blending tool of FIGS. 1A-3B). In some implementations, one or more process blocks of FIG. 6 may be performed by another device or a group of devices separate from or including the semiconductor slurry blending tool. Additionally, or alternatively, one or more process blocks of FIG. 6 may be performed by one or more components of a device 500, such as processor 520, memory 530, storage component 540, input component 550, output component 560, communication interface 570, and/or the like.

As shown in FIG. 6, process 600 may include receiving one or more materials in a blending tank via at least one inlet pipe connected to the blending tank, wherein the at least one inlet pipe vertically enters the blending tank and does not contact the blending tank (block 610). For example, the semiconductor slurry blending tool may receive one or more materials in a blending tank via at least one inlet pipe connected to the blending tank, as described above.

As further shown in FIG. 6, process 600 may include blending the one or more materials in the blending tank into the slurry with a blending pump that is partially provided within the blending tank, wherein the blending pump prevents blending of the one or more materials into the slurry until after the one or more materials are provided to the blending tank (block 620). For example, the semiconductor slurry blending tool may blend the one or more materials in the blending tank into the slurry with a blending pump that is partially provided within the blending tank, as described above.

As further shown in FIG. 6, process 600 may include removing the slurry from the blending tank with a single outlet pipe connected to the blending pump (block 630). For example, the semiconductor slurry blending tool may remove the slurry from the blending tank with a single outlet pipe connected to the blending pump, as described above.

Process 600 may include additional implementations, such as any single implementation or any combination of implementations described below and/or in connection with one or more other processes described elsewhere herein.

In a first implementation, process 600 includes controlling the receiving of the one or more materials in the blending tank with a pressure relief device associated with the at least one inlet pipe.

In a second implementation, alone or in combination with the first implementation, the blending tank is supported by a support base with reinforced feet.

In a third implementation, alone or in combination with one or more of the first and second implementations, process 600 includes measuring a level of the slurry or the one or more materials in the blending tank with one or more tank level sensors connected to a tank level sensor bracket, wherein the tank level sensor bracket and the one or more is tanking level sensors are provided adjacent to an exterior sidewall of the blending tank and do not contact the exterior sidewall of the blending tank.

In a fourth implementation, alone or in combination with one or more of the first through third implementations, the single outlet pipe includes a stress relief heat treated plastic.

In a fifth implementation, alone or in combination with one or more of the first through fourth implementations, process 600 includes providing the slurry to a semiconductor chemical-mechanical polishing tool.

In a sixth implementation, alone or in combination with one or more of the first through fifth implementations, the slurry is associated with a maximum measurement error of less than three grams.

In a seventh implementation, alone or in combination with one or more of the first through sixth implementations, the slurry is associated with a reproducibility error of less than two and half grams.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

In this way, the high-throughput, precise semiconductor slurry blending tool may generate high quality slurries that meet slurry requirements for a large quantity of advanced semiconductor processes. For example, the high-throughput, precise semiconductor slurry blending tool may produce high quality slurries (e.g., with a quality error of seventeen ppm of contamination), and may only require one day to modify a semiconductor slurry blending tool for a different slurry. This may significantly reduce cycle times associated with a semiconductor processing schedule (e.g., by two-hundred and thirty days), and may result in significant cost savings each year. Furthermore, the high-throughput, precise semiconductor slurry blending tool may improve flexibility of slurry blending by dynamically adjusting a blending recipe and measuring a difference in raw material quality.

As described in greater detail above, some implementations described herein provide a slurry blending tool. The slurry blending tool may include a blending tank to receive and blend one or more materials into a slurry, and at least one inlet pipe connected to the blending tank and to provide the one or more materials to the blending tank. The at least one inlet pipe may vertically enter the blending tank and may not contact the blending tank. The slurry blending tool may include a blending pump partially provided within the blending tank and to blend the one or more materials into the slurry, and an outlet pipe connected to the blending pump and to remove the slurry from the blending tank.

As described in greater detail above, some implementations described herein provide a method of making a slurry. The method may include receiving one or more materials in a blending tank via at least one inlet pipe connected to the blending tank, where the at least one inlet pipe may vertically enter the blending tank and may not contact the blending tank. The method may include blending the one or more materials in the blending tank into the slurry with a blending pump that is partially provided within the blending tank, where the blending pump may prevent blending of the one or more materials into the slurry until after the one or more materials are provided to the blending tank. The method may include removing the slurry from the blending tank with a single outlet pipe connected to the blending pump.

As described in greater detail above, some implementations described herein provide a slurry blending tool. The slurry blending tool may include a blending tank to receive and blend one or more materials into a slurry, and a support base with reinforced feet to support the blending tank. The slurry blending tool may include at least one inlet pipe connected to the blending tank and to provide the one or more materials to the blending tank. The at least one inlet pipe may vertically enter the blending tank and may not contact the blending tank. The at least one inlet pipe may be associated with a pressure relief device to control provision of the one or more materials to the blending tank. The slurry blending tool may include a blending pump partially provided within the blending tank and to blend the one or more materials into the slurry. The blending pump may prevent blending of the one or more materials into the slurry until after the one or more materials are provided to the blending tank. The slurry blending tool may include an outlet pipe connected to the blending pump, where the outlet pipe may provide a single point of connection from the blending pump to remove the slurry from the blending tank, and where the outlet pipe may include a stress relief heat treated plastic. The slurry blending toll may include a tank level sensor bracket, and one or more tank level sensors connected to the tank level sensor bracket and to measure a level of the slurry or the one or more materials in the blending tank. The tank level sensor bracket and the one or more tank level sensors may be provided adjacent to an exterior sidewall of the blending tank and may not contact the exterior sidewall of the blending ta The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that those skilled in the art may make various changes, substitutions, and alterations herein without departing from the spirit and scope of the present disclosure.

What is claimed is:

1. A slurry blending tool, comprising:
   a blending tank to receive and blend one or more materials into a slurry;
   at least one inlet pipe connected to a top portion of the blending tank and to provide the one or more materials to the blending tank,
      wherein the at least one inlet pipe vertically enters the blending tank and does not contact the blending tank;
   a blending pump partially provided within the blending tank and to blend the one or more materials into the slurry; and
   an outlet pipe connected to a bottom portion of the blending pump and to remove the slurry from the blending tank.

2. The slurry blending tool of claim 1, further comprising: a support base with reinforced feet to support the blending tank.

3. The slurry blending tool of claim 1, further comprising:
   a tank level sensor bracket; and
   one or more tank level sensors connected to the tank level sensor bracket and to measure a level of the slurry or the one or more materials in the blending tank,
      wherein the tank level sensor bracket and the one or more tank level sensors are provided adjacent to an exterior sidewall of the blending tank and do not contact the exterior sidewall of the blending tank.

4. The slurry blending tool of claim 1, wherein the at least one inlet pipe is associated with a pressure relief device to control provision of the one or more materials to the blending tank.

5. The slurry blending tool of claim 1, wherein the blending pump is configured to prevent blending of the one or more materials into the slurry until after the one or more materials are completely provided to the blending tank.

6. The slurry blending tool of claim 1, wherein the outlet pipe provides a single point of connection from the blending pump to remove the slurry from the blending tank.

7. The slurry blending tool of claim 1, wherein the outlet pipe includes a stress relief heat treated plastic.

8. The slurry blending tool of claim 1, wherein the slurry is associated with a quality error of less than or equal to seventeen parts per million (ppm) of contamination.

9. The slurry blending tool of claim 1, wherein the slurry is to be utilized by a semiconductor chemical-mechanical polishing tool.

10. The slurry blending tool of claim 1, wherein the slurry is associated with a maximum measurement error of less than three grams.

11. The slurry blending tool of claim 1, wherein the slurry is associated with a reproducibility error of less than two and half grams.

12. A method of using a slurry blending tool to make a slurry, the method comprising:
   receiving one or more materials in a blending tank via at least one inlet pipe connected to a top portion of the blending tank,
      wherein the at least one inlet pipe vertically enters the blending tank and does not contact the blending tank;
   blending the one or more materials in the blending tank into the slurry with a blending pump that is partially provided within the blending tank,
      wherein the blending pump prevents blending of the one or more materials into the slurry until after the one or more materials are provided to the blending tank; and
   removing the slurry from the blending tank with a single outlet pipe connected to a bottom portion of the blending pump.

13. The method of claim 12, further comprising:
   controlling the receiving of the one or more materials in the blending tank with a pressure relief device associated with the at least one inlet pipe.

14. The method of claim 12, wherein the blending tank is supported by a support base with reinforced feet.

15. The method of claim 12, further comprising:
   measuring a level of the slurry or the one or more materials in the blending tank with one or more tank level sensors connected to a tank level sensor bracket,
      wherein the tank level sensor bracket and the one or more tank level sensors are provided adjacent to an exterior sidewall of the blending tank and do not contact the exterior sidewall of the blending tank.

16. The method of claim 12, wherein the single outlet pipe includes a stress relief heat treated plastic.

17. The method of claim 12, further comprising:
   providing the slurry to a semiconductor chemical-mechanical polishing tool.

18. The method of claim 12, wherein the slurry is associated with a maximum measurement error of less than three grams.

19. The method of claim 12, wherein the slurry is associated with a reproducibility error of less than two and half grams.

20. A slurry blending tool, comprising:
- a blending tank to receive and blend one or more materials into a slurry;
- a support base with reinforced feet to support the blending tank;
- at least one inlet pipe connected to a top portion of the blending tank and to provide the one or more materials to the blending tank,
  - wherein the at least one inlet pipe vertically enters the blending tank and does not contact the blending tank,
  - wherein the at least one inlet pipe is associated with a pressure relief device to control provision of the one or more materials to the blending tank;
- a blending pump partially provided within the blending tank and to blend the one or more materials into the slurry,
  - wherein the blending pump prevents blending of the one or more materials into the slurry until after the one or more materials are provided to the blending tank;
- an outlet pipe connected to a bottom portion of the blending pump,
  - wherein the outlet pipe provides a single point of connection from the blending pump to remove the slurry from the blending tank,
  - wherein the outlet pipe includes a stress relief heat treated plastic;
- a tank level sensor bracket; and
- one or more tank level sensors connected to the tank level sensor bracket and to measure a level of the slurry or the one or more materials in the blending tank,
  - wherein the tank level sensor bracket and the one or more tank level sensors are provided adjacent to an exterior sidewall of the blending tank and do not contact the exterior sidewall of the blending tank.

* * * * *